United States Patent
Esteves et al.

(10) Patent No.: US 11,482,660 B1
(45) Date of Patent: Oct. 25, 2022

(54) METAL STACK TEMPLATES FOR SUPPRESSING SECONDARY GRAINS IN SCAlN

(71) Applicant: National Technology & Engineering Solutions of Sandia, LLC, Albuquerque, NM (US)

(72) Inventors: Giovanni Esteves, Albuquerque, NM (US); Erica Ann Douglas, Albuquerque, NM (US); Michael David Henry, Albuquerque, NM (US); Benjamin Griffin, Arlington, VA (US); Morgann Berg, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 550 days.

(21) Appl. No.: 16/661,393

(22) Filed: Oct. 23, 2019

Related U.S. Application Data

(60) Provisional application No. 62/750,405, filed on Oct. 25, 2018.

(51) Int. Cl.
| | |
|---|---|
| *H01L 41/18* | (2006.01) |
| *H01L 41/12* | (2006.01) |
| *H01L 41/04* | (2006.01) |
| *H01L 41/20* | (2006.01) |
| *H01L 41/06* | (2006.01) |
| *H01L 41/09* | (2006.01) |
| *H01L 41/083* | (2006.01) |
| *H01L 41/08* | (2006.01) |

(Continued)

(52) U.S. Cl.
CPC ...... *H01L 41/0838* (2013.01); *H01L 41/0805* (2013.01); *H01L 41/0831* (2013.01); *H01L 41/183* (2013.01); *H01L 41/27* (2013.01); *H01L 41/37* (2013.01)

(58) Field of Classification Search
CPC ....... H01L 41/27; H01L 41/37; H01L 41/183; H01L 41/0805; H01L 41/0831; H01L 41/0838
USPC ......................................................... 310/314
See application file for complete search history.

(56) References Cited

PUBLICATIONS

Ababneh, A. et al., "c-axis orientation and piezoelectric coefficients of AlN thin films sputter-deposited on titanium bottom electrodes," Applied Surface Science (2012) 259:59-65.

(Continued)

*Primary Examiner* — Emily P Pham
*Assistant Examiner* — Monica Mata
(74) *Attorney, Agent, or Firm* — Mark A. Dodd

(57) ABSTRACT

A metal stack for templating the growth of AlN and ScAlN films is disclosed. The metal stack comprises one, two, or three layers of metal, each of which is compatible with CMOS post-processing. The metal stack provides a template that promotes the growth of highly textured c-axis {002} AlN and ScAlN films. The metal stacks include one or more metal layers with each metal layer having either a hexagonal {002} orientation or a cubic {111} orientation. If the metal stack includes two or more metal layers, the layers can alternate between hexagonal {002} and cubic {111} orientations. The use of ScAlN results in a higher piezoelectric constant compared to that of AlN for ScAlN alloys up to approximately 44% Sc. The disclosed metal stacks resulted in ScAlN films having XRD FWHM values of less than approximately 1.1° while significantly reducing the formation of secondary grains in the ScAlN films.

16 Claims, 10 Drawing Sheets

(51) Int. Cl.
  *H01L 41/27*  (2013.01)
  *H01L 41/37*  (2013.01)

(56) References Cited

PUBLICATIONS

Doll, J. C. et al., "Aluminum nitride on titanium for CMOS compatible piezoelectric transducers," Journal of Micromechanics and Microengineering (2010) 20:025008, 8 pages.

Dubois, M.-A. et al., "Stress and piezoelectric properties of aluminum nitride thin films deposited onto metal electrodes by pulsed direct current reactive sputtering," Journal of Applied Physics (2001) 89(11):6389-6395.

Ekkels, P. et al., "Evaluation of platinum as a structural thin film material for RF-MEMS devices," Journal of Micromechanics and Microengineering (2009) 19:065010, 8 pages.

Esteves, G. et al., "CMOS compatible metal stacks for suppression of secondary grains in Sc0.125Al0.875N," J. Vac. Sci. Technol. A. (2019) 37(2):021511-1-021511-8.

Fang, W. et al., "On the thermal expansion coefficients of thin films," Sensors and Actuators (2000) 84:310-314.

Fichtner, S. et al., "Identifying and overcoming the interface originating c-axis instability in highly Sc enhanced AlN for piezoelectric micro-electromechanical systems," Journal of Applied Physics (2017) 122:035301, 7 pages.

Gagnon, G. et al., "Effect of the oxidation of TiN on the stability of the Al/TiN interface," J. Appl. Phys. (1996) 80 (1):188-195.

Henry, M. D. et al., "Reactive sputter deposition of piezoelectric Sc0.12Al0.88N for contour mode resonators," J. Vac. Sci. Technol. B (2018) 36(3), 03E104-1-03E104-8.

Hung, L. S. et al., "Kinetics of TiSi2 formation by thin Ti films on Si," J. Appl. Phys. (1983) 54(9):5076-5080.

Lee, J.-B. et al., "Effects of bottom electrodes on the orientation of AlN films and the frequency responses of resonators in AlN-based FBARs," Thin Solid Films (2004) 447-448:610 614.

Loebl, H. P. et al., "Piezoelectric thin AlN films for bulk acoustic wave (BAW) resonators," Materials Chemistry and Physics (2003) 79:143-146.

Lu, Y. et al., "Elastic modulus and coefficient of thermal expansion of piezoelectric Al1-xScxN (up to x = 0.41) thin films," APL Materials (2018) 6:076105, 6 pages.

Mertin, S. et al., "Piezoelectric and structural properties of c-axis textured aluminium scandium nitride thin films up to high scandium content," Surface & Coatings Technology (2018) 343:2-6.

Nemanich, R. J. et al., "Raman Scattering Characterization of Titanium Silicide Formation," IEEE Journal of Quantum Electronics (1989) 25(5):997-1002.

Norstrom, H. et al., "Limitation of Ti/TiN diffusion barrier layers in silicon technology," Vacuum (1985) 35 (12):547-553.

Rossnagel, S. M. et al., "Metal ion deposition from ionized mangetron sputtering discharge," J. Vac. Sci. Technol. B (1994) 12(1):449-453.

Sadeghpour, S. et al., "Crystalline growth of AlN thin films by atomic layer deposition," 27th Micromechanics and Microsystems Europe Workshop, Journal of Physics: Conference Series 757 (2016) 5 pages.

Shimazaki, A. et al., "Metallic Contamination Control in Leading-edge ULSI Manufacturing," Solid State Phenomena (2009) 145-146:115-121.

Venkatraman, R. et al., "Separation of film thickness and grain boundary strengthening effects in Al thin films on Si," J. Mater. Res. (1992) 7(8):2040-2048.

Wang, Q. et al., "Design, Fabrication, and Characterization of Scandium Aluminum Nitride-Based Piezoelectric Micromachined Ultrasonic Transducers," Journal of Microelectromechanical Systems (2017) 26(5): 1132-1139.

Ti/TiN/AlCu

Ti

Ti/TiN

METAL STACK TEMPLATES FOR SUPPRESSING SECONDARY GRAINS IN SCAlN

CROSS-REFERENCE TO RELATED APPLICATION

This application claims the benefit of U.S. Provisional Application No. 62/750,405, filed Oct. 25, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to metal stack templates that are compatible with standard CMOS processing and that also suppress the formation of secondary grains in $Sc_xAl_{1-x}N$ (x=0-0.44).

BACKGROUND

The piezoelectric material ScAlN holds great promise in many technologies including CMOS and microelectromechanical systems (MEMS). Alloying aluminum nitride (AlN) with scandium (Sc) enhances several properties of AlN, a CMOS-compatible piezoelectric material that is being widely explored. In particular, the piezoelectric constant $d_{33}$ for $Sc_{0.41}Al_{0.59}N$ is 31.6 pC/N, a 550% increase over the 5.5 pC/N value for AlN. See Y. Lu et al., Elastic modulus and coefficient of thermal expansion, APL Materials, vol. 6, 076105 (2018), the contents of which are herein incorporated by reference. This increase in the piezoelectric constant results in a theoretical increase in its electromechanical coupling coefficient $k_r^2$, from 7% in AlN to 15% for $Sc_{0.3}Al_{0.7}N$.

This increased piezoelectric constant and electromechanical coupling coefficient improves the performance of numerous MEMS devices including RF filters, sensors (e.g., microphones and finger print detectors), speakers, ultrasonic transducers, micro-actuators, and energy harvesters. See S. Mertin et al., Piezoelectric and structural properties of c-axis textured aluminum scandium nitride thin films up to high scandium content, Surface & Coatings Technology, vol. 6, pp. 2-6 (2018), the contents of which are herein incorporated by reference.

The use of ScAlN as a piezoelectric material places an upper limit on the amount of Sc that can be substituted for Al in the resultant wurtzite crystal structure. In particular, once the Sc content reaches approximately 44%, the crystal structure begins to change from wurtzite to non-polar rocksalt, at which point the ScAlN loses its piezoelectric properties. See S. Fichtner et al., Identifying and overcoming the interface originating c-axis instability in highly Sc enhanced AlN for piezoelectric micro-electromechanical systems, Journal of Applied Physics, vol. 122, 035301 (2017), the contents of which are herein incorporated by reference.

The partial substitution of Sc for Al in AlN creates crystallinity issues as growth of ScAlN can readily result in the formation of secondary grains (SG). AlN and ScAlN preferably grow in a columnar fashion with a hexagonal crystal structure in the {002} c-axis direction to maximize the piezoelectric constant $d_{33}$. See M. D. Henry et al., Reactive sputter deposition of piezoelectric $Sc_{0.12}Al_{0.88}N$ for contour mode resonators, Journal of Vacuum Science & Technology B, vol. 36, 03E104 (2018), the contents of which are herein incorporated by reference. However, this study showed that the SG density can be reduced by controlling the stress in the ScAlN film. As shown in FIGS. 1A and 1B, these SG may form early in the ScAlN deposition process.

In an effort to promote growth of ScAlN in the desired {002} c-axis direction, a number of researchers have explored the use of various template materials grown on a substrate prior to growth of the ScAlN film. For example, S. Mertin et al. explored the use of a {111} oriented face centered cubic (FCC) platinum (Pt) templating layer and a {110} oriented molybdenum (Mo) templating layer. The authors of S. Mertin et al. discovered that the formation of SG started at lower Sc concentrations for films grown on Mo template layers (25% Sc) compared to films grown on Pt template layers (34%), i.e., that a Pt template layer was preferable.

As another example of template exploration, this time for an AlN film not a ScAlN film, the authors of J. C. Doll et al. reported on the use of a double-layer AlN (140 nm)/titanium (Ti) (85 nm) template. See J. C. Doll et al., Aluminum nitride on titanium for CMOS compatible piezoelectric transducers, Journal of Micromechanics and Microengineering, 20, 025008 (2010), the contents of which are herein incorporated by reference. The authors of S. Fichtner et al. reported use of an AlN layer to promote growth of the desired {110} Mo layer, resulting in a double-layer AlN (100 nm)/Mo (100 nm) template for the growth of ScAlN films. The authors of S. Fichtner et al. also reported that they subjected the AlN/Mo template to a facultative etching process and a water rinse prior to depositing their ScAlN film. The authors of Q. Wang et al. reported the use of a double-layer ScAlN (30 nm)/Mo (200 nm) template, with the ScAlN layer included as a seed layer to achieve a good crystalline Mo layer. See Q. Wang et al., Design, Fabrication, and Characterization of Scandium Aluminum Nitride-Based Piezoelectric Micromachined Ultrasonic Transducers, to be published in Journal of Microelectromechanical Systems, the contents of which are herein incorporated by reference.

The authors of J.-B. Lee et al. reported on their study of the use of Al, copper (Cu), Ti, and Mo single-layer templates for the growth of AlN. See J.-B. Lee et al., Effects of bottom electrodes on the orientation of AlN films and the frequency responses of resonators in AlN-based FBARs, Thin Solid Films, 447-448, pp. 610-614 (2004), the contents of which are herein incorporated by reference. This study showed that a single layer of Mo provided the best template, and that a Ti single-layer template had almost twice the thermal expansion coefficient of a Mo single-layer template, possibly leading to the numerous observed SG for the AlN film grown on the Ti single-layer template.

The authors of S. Sadeghpour et al. reported on their study comparing the use of a Ti single-layer template relative to growing an AlN film directly on a {100} oriented Si substrate. See S. Sadeghpour et al., Crystalline growth of AlN thin films by atomic layer deposition, Journal of Physics: Conference Series 757, 012003 (2016), the contents of which are herein incorporated by reference. This study showed that growing the AlN film directly on the {100} Si produced a higher quality film than growth on the Ti single-layer template, as the AlN film grown on the Ti single-layer template and the AlN film grown directly on the {100} Si had surface roughnesses of 0.71 nm and 0.35 nm, respectively.

In yet another study, the authors of M.-A. Dubois and P. Muralt reported on the growth of AlN films on {111} Pt, {111} Al, {002} Ti, single-layer templates, as well as single crystal sapphire. See M.-A. Dubois and P. Muralt, Stress and piezoelectric properties of aluminum nitride thin films deposited onto metal electrodes by pulsed direct current reactive sputtering, Journal of Applied Physics, vol. 89, no. 11, pp. 6389-6395 (2001), the contents of which are herein incorporated by reference. This study showed that the Pt single-layer template consistently produced the highest piezoelectric constant, with the Al single-layer template frequently producing better results than the Ti single-layer template. The authors of M.-A. Dubois and P. Muralt noted that a non-negligible amount of N from the AlN film was incorporated into the Ti single-layer template, and thus the Ti single-layer template was not stable, thereby preventing well controlled nucleation of the AlN film.

In summary, the results in these numerous studies for a suitable template for AlN and ScAlN films showed that the best results in many cases were achieved using a Pt single-layer template, while teaching away from the use of Ti or Al single-layer templates. The problem with a Pt single-layer template is that it is not post CMOS compatible as Pt will "poison" the underlying CMOS circuitry. See A Shimazaki et al., Metallic contamination control in leading edge VLSI manufacturing, Solid State Phenomena, vol. 145-146, pp. 115-121 (2009), the contents of which are herein incorporated by reference. Thus, there exists a need for a template that promotes the growth of c-axis oriented ScAlN, which will enable a high piezoelectric response. Further, the template should be compatible with post-CMOS processing, thereby enabling the integration of piezoelectric devices directly with CMOS circuitry.

SUMMARY

One aspect of the present invention relates to templates that will promote growth of high crystal quality $Sc_xAl_{1-x}N$ (x=0–0.44) in the desired c-axis direction, thereby resulting in a ScAlN film having a high piezoelectric constant. This requires a template that is closely lattice matched to the ScAlN film and that is highly textured, i.e., has a narrow full width at half maximum (FWHM) x-ray diffraction (XRD) rocking curve for the ScAlN {002} reflection. To this end, the template includes one or more metal layers with each metal layer having either a hexagonal {002} orientation or a cubic {111} orientation. Further, when the template includes two or more metal layers, the layers can alternate between hexagonal {002} and cubic {111} orientations. Another aspect of the present invention relates to templates that are compatible with post-CMOS processing, thereby enabling the integration of ScAlN-based piezoelectric devices directly with CMOS circuitry.

To this end, one embodiment of the present invention employs a single-layer metal stack template of Ti. Another embodiment of the present invention employs a double-layer metal stack template with a Ti layer and an $AlCu_{0.005}$ layer (Ti/AlCu). Yet another embodiment of the present invention employs a triple-layer metal stack template with a Ti layer, a titanium nitride (TiN) layer, and an $AlCu_{0.005}$ layer (Ti/TiN/AlCu). In preferred embodiments of the present invention, the Ti layer is deposited by an ionized metal plasma (IMP) process as this yields a more highly textured template than does a Ti layer deposited by a traditional sputtering process.

In at least one embodiment of the present invention, a piezoelectric device comprises a substrate, a metal stack on the substrate (the metal stack providing a template for a subsequent highly textured hexagonal c-axis crystal orientation ScAlN piezoelectric layer, the metal stack being formed of one or more post-CMOS process compatible metals) and a ScAlN piezoelectric film on a template surface of the metal stack (the ScAlN piezoelectric layer having a composition between AlN and $Sc_{0.44}Al_{0.56}N$.

In various embodiments of the present invention: the substrate may be a semiconductor wafer, a processed semiconductor wafer, a composite wafer, or a cavity SOI wafer; and the piezoelectric device further includes a sub-template layer between the substrate and the metal stack.

In other embodiments of the present invention: the metal stack comprises a single-layer metal stack including a metal having a hexagonal {002} orientation or a metal having a cubic {111} orientation; if the single-layer metal stack is a metal having a hexagonal {002} orientation, the metal stack includes titanium (Ti) or scandium (Sc), and if the single-layer metal stack is a metal having a cubic {111} orientation, the metal stack includes tantalum nitride (TaN), niobium nitride (NbN), or aluminum scandium ($Al_3Sc$).

In still other embodiments of the present invention: the metal stack comprises a double-layer metal stack, with a first layer of the double-layer metal stack formed on the surface of the substrate (the first layer including a metal having a first orientation), and a second layer of the double-layer metal stack formed on a surface of the first layer of the metal stack (the second layer including a metal having a second orientation, with one of the first orientation and the second orientation being a hexagonal {002} orientation and the other one of the first orientation and the second orientation being a cubic {111} orientation); the first layer includes titanium (Ti), scandium (Sc), tantalum nitride (TaN), niobium nitride (NbN), or aluminum scandium ($Al_3Sc$); and the second layer includes aluminum (Al) or an alloy of aluminum (Al) and copper (Cu) containing approximately 0.5 wt % Cu.

In further embodiments of the present invention: the metal stack comprises a triple-layer metal stack, with a first layer of the triple-layer metal stack formed on the surface of the substrate (the first layer including a metal having a first orientation), a second layer of the triple-layer metal stack formed on a surface of the first layer (the second layer including a metal having a second orientation, with one of the first orientation and the second orientation being a hexagonal {002} orientation and the other one of the first orientation and the second orientation being a cubic {111} orientation), and a third layer of the triple-layer metal stack formed on a surface of the second layer of the metal stack; the first layer includes titanium (Ti), scandium (Sc), tantalum nitride (TaN), niobium nitride (NbN), or aluminum scandium ($Al_3Sc$); the second layer includes titanium nitride (TiN); and the third layer includes aluminum (Al) or an alloy of aluminum (Al) and copper (Cu) containing approximately 0.5 wt % Cu.

In yet other embodiments of the present invention: the metal stack is formed under continuous vacuum conditions; and at least a portion of the metal stack is deposited by an ionized metal plasma (IMP) process.

Embodiments of the present invention also include: a method for suppressing the formation of secondary grains in a ScAlN piezoelectric film, the method including the steps of providing a substrate, forming a metal stack on a surface of the substrate (the metal stack providing a template for a subsequent highly textured hexagonal c-axis crystal orientation ScAlN piezoelectric layer, the metal stack being formed of one or more post-CMOS process compatible metals, the metal stack comprising one or more layers with each layer of the metal stack including a metal having a hexagonal {002} orientation or a cubic {111} orientation), and forming the ScAlN piezoelectric film on a template surface of the surface of the metal stack (the ScAlN piezoelectric layer having a composition between AlN and $Sc_{0.44}Al_{0.56}N$); at least a portion of the metal stack formed by an ionized metal plasma (IMP) process; the metal stack is formed under continuous vacuum conditions; and one of the one or more layers in the metal stack includes titanium (Ti), scandium (Sc), tantalum nitride (TaN), niobium nitride (NbN), aluminum scandium ($Al_3Sc$), titanium nitride (TiN), or aluminum (Al).

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Single-, Double-, and Triple-Layer Metal Stack Templates

Figure 1A:
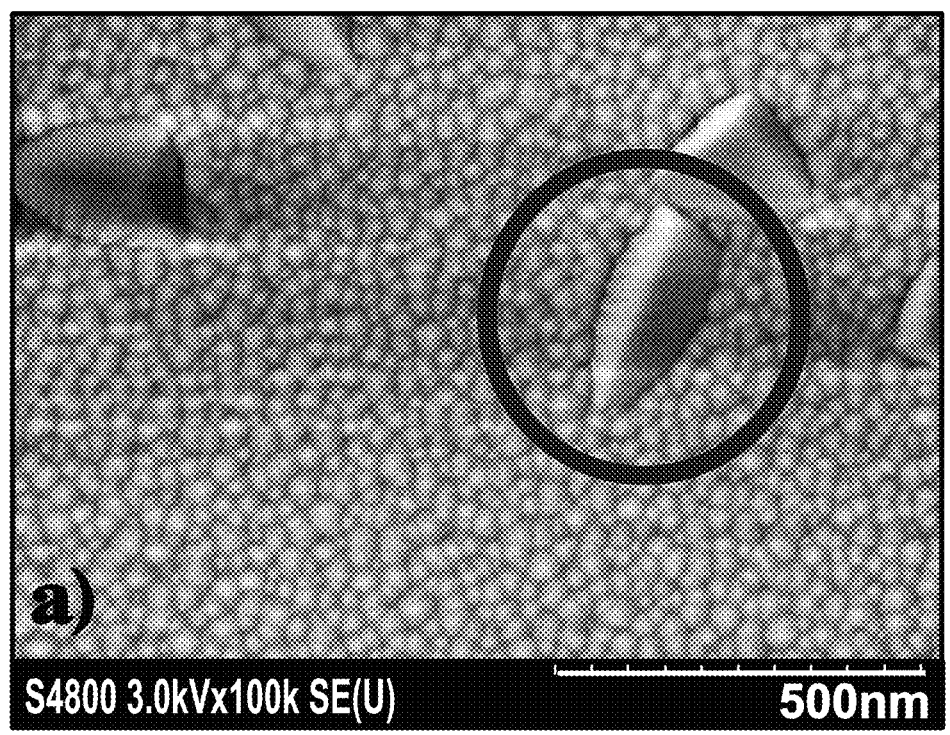
FIGS. 1A and 1B illustrate prior art ScAlN films grown without a template showing multiple SG features.
Figure 1B:
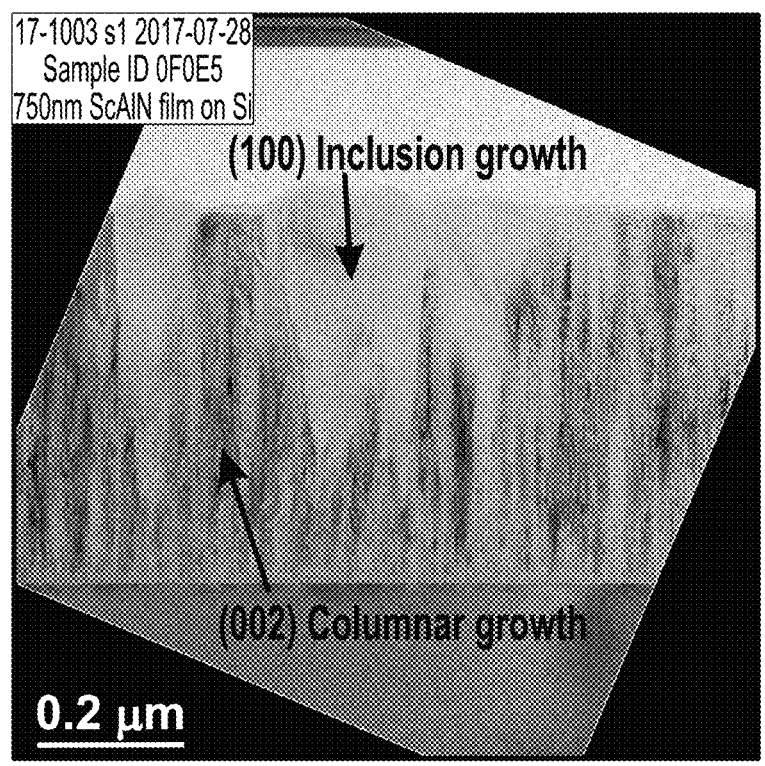
Figure 2:
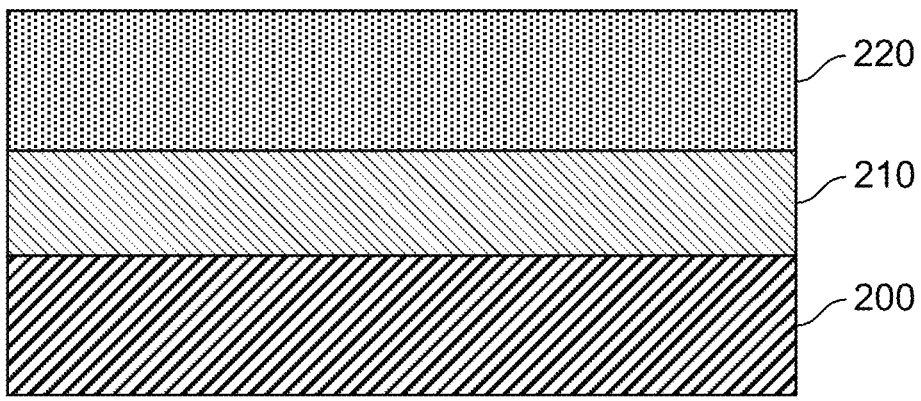
FIG. 2 illustrates an embodiment of the present invention having a single-layer metal stack template.

FIG. 2 illustrates a single-layer metal stack 210 formed on a substrate 200. A ScAlN film 220 is formed on a template surface of the single-layer metal stack 210.

The substrate 200 may be any suitable substrate including a semiconductor wafer, for example a silicon (Si) wafer; a processed semiconductor wafer with one or more integrated circuits and/or one or more microelectromechanical systems (MEMSs) formed thereon; a composite wafer, for example a semiconductor-on-insulator (SOI) wafer or an insulator on semiconductor wafer, e.g., a surface oxidized Si wafer; or a cavity SOI wafer in which one or more cavities is formed below the semiconductor layer.

The single-layer metal stack 210 is preferably formed of a layer of hexagonal Ti having a {002} orientation. The single-layer metal stack 210 is preferably formed of a Ti layer deposited by an ionized metal plasma (IMP) process. The IMP process is based on conventional magnetron sputtering with the addition of a high density, inductively coupled RF plasma in the region between the sputtering target and the substrate 200. Metal atoms, in this case Ti atoms, are sputtered from the target due to bombardment by Ar atoms and then transit the RF plasma region, where the Ti atoms are ionized. The Ti ions are then accelerated to the substrate 200 by means of a low voltage dc bias, such that the Ti ions arrive at the substrate 200 at normal incidence and at a specified energy. See S. M. Rossnagel and J. Hopwood, Metal ion deposition from ionized magnetron sputtering discharge, Journal of Vacuum Science and Technology B, vol. 12, no. 1, pp. 449-453 (1994), the contents of which are herein incorporated by reference. Depositing the single-layer metal stack 210 of Ti using IMP yields a highly textured template, which promotes the growth of a highly textured, c-axis oriented ScAlN film 220. See G. Esteves et al., CMOS Compatible Metal Stacks for Suppression of Secondary Grains in $Sc_{0.125}Al_{0.875}N$, Journal of Vacuum Science and Technology A, vol. 37, no. 2, pp. 21511-1-21511-8 (2019), the contents of which are herein incorporated by reference. The preferred process parameters for this IMP process are 15-50 sccm of Ar gas at a chamber pressure of 10 mTorr and a deposition temperature of 180-230° C. with a DC power of 2000 W and an RF power of 2500 W. These process parameters place the Ti layer in a very tensile stress state, with a 50 nm Ti layer yielding 700 MPa.

In other embodiments of the present invention, the single-layer metal stack 210 may be formed of materials other than Ti. These other embodiments may employ, for example, hexagonal Sc with a {002} orientation, cubic tantalum nitride (TaN) with a {111} orientation, cubic niobium nitride (NbN) with a {111} orientation, or cubic aluminum scandium ($Al_3Sc$) with a {111} orientation. Other metals may also be employed. For a cubic crystal structure metal, it should be deposited in the {111} orientation and have a lattice parameter $a_c$ in the range of 3.9270 Å to 5.4640 Å to allow for minimal lattice mismatch (<|2%|) between the cubic bottom metal and the hexagonal $Sc_xAl_{1-x}N$ for x=0 to 0.44. For a hexagonal crystal structure metal, the {002} orientation is best, with a lattice parameter an in the range of 2.7768 Å to 3.8636 Å to allow for minimal lattice mismatch with the hexagonal $Sc_xAl_{1-x}N$ for x=0 to 0.44. For smaller lattice mismatches between the cubic {111} and ScAlN as well as the hexagonal {002} and ScAlN, refer to Table 1. As an example based upon Table 1, if one wanted a lattice mismatch of no more than 2% for a cubic {111} metal template to AlN, the cubic {111} metal template would need a lattice parameter $a_c$ between 4.3120 Å and 4.4880 Å. As another example based upon Table 1, if one wanted a lattice mismatch of no more than 6% for a hexagonal {002} metal template to $Sc_{0.44}Al_{0.56}N$, the hexagonal {002} metal template would need a lattice parameter an between 3.2075 Å and 3.6170 Å. The lattice parameters an for AlN and ScAlN used for these calculations range from 3.11 Å for AlN to 3.40 Å for $Sc_{0.44}Al_{0.56}N$.

TABLE 1

List of hexagonal and cubic lattice parameters needed to template ScAlN. Lattice Mismatch to $Sc_xAl_{1-x}N$ (x = 0-0.44)

| Metal template | 2% | | 6% | | 12% | |
|---|---|---|---|---|---|---|
| | Positive | Negative | Positive | Negative | Positive | Negative |
| $a_c$ {111} (Å) | 4.3120-4.7140 | 4.4880-4.9065 | 4.1492-4.5362 | 4.6789-5.1152 | 3.9270-4.2931 | 4.9980-5.464 |
| $a_h$ {002} (Å) | 3.0490-3.3333 | 3.1735-3.4694 | 2.9340-3.2075 | 3.3085-3.6170 | 2.7768-3.0357 | 3.5341-3.8636 |

Unit cell values are ranges as Sc-content increases in ScAlN.
Positive and Negative columns refer to whether mismatch is positive or negative.

As a person of ordinary skill in the art will appreciate, depending upon the underlying substrate 200 and the method used to deposit the single-layer metal stack 210, a sub-template layer (not illustrated) may preferably be employed. For example, a sub-template layer of Ti, TiN, or TaN could be formed between the substrate 200 and the single-layer metal stack 210. This sub-template layer preferably has a thickness of approximately 20 nm to 150 nm.

Overall, the combination of a hexagonal {002} oriented layer and a cubic {111} oriented metal layer results in the desired metal stack for subsequent growth of a layer comprising hexagonal $Sc_xAl_{1-x}N$ for x=0 to 0.44. When the hexagonal layer is Ti, for example, in combination with Mo or NbN, the mismatch is relatively moderate at less than approximately 7%. By employing, for example, Sc, as the hexagonal layer, the tolerable mismatch may approach 14% for Sc/$Al_3$Sc and Sc/AlCu.

The single-layer metal stack 210 may have any suitable thickness. In a preferred embodiment, the single-layer metal stack 210 of Ti has a preferred thickness of approximately 20 nm to approximately 100 nm, though thicknesses from 20 nm to 250 nm, may be employed in alternative embodiments. A thinner single-layer metal stack 210 of Ti offers the benefit of a shorter growth time for the single-layer metal stack 210 and a lower tensile stress state. A thicker single-layer metal stack 210 of Ti offers the benefit of a more highly textured hexagonal {002} oriented Ti film at the cost of a higher tensile stress. The primary driver in selecting both the deposition method of, and the thickness for, the single-layer metal stack 210 of Ti is the need to provide a suitable template for the subsequent highly textured hexagonal {002} oriented ScAlN film 220.

The ScAlN film 220 may have any suitable Sc composition from 0% to approximately 44%. The ScAlN film 220 may be grown by any suitable method. The ScAlN film may be grown by physical vapor deposition (PVD), while in other embodiments the ScAlN film 220 may be grown by molecular beam epitaxy (MBE). PVD may take many forms, including sputtering or evaporation of the material used to grow the ScAlN film 220. In a preferred embodiment, the ScAlN film 220 is grown by reactive RF sputtering from a single ScAl target, with $N_2$ and Ar as the process gases. In a more preferred embodiment, the ScAlN film 220 is grown using a pulse DC sputtering process. In other embodiments, especially those requiring a Sc composition between approximately 20% and approximately 44%, co-sputtering may be employed, in which separate Sc and Al targets are used, with $N_2$ and Ar as the process gases.

The ScAlN film 220 may have any suitable thickness. In a preferred embodiment, the ScAlN film 220 has a thickness of approximately 750 nm, though thicknesses from 150 nm to 2 μm may be employed in alternative embodiments. Greater thicknesses for the ScAlN film 220 may result in slightly higher SG densities. As a person of ordinary skill in the art will appreciate, the desired thickness of the ScAlN film 220 is a function of the final device type. For example, if the final device is a micro-resonator (e.g., a bulk acoustic wave (BAW) contour mode resonator (CMR), a BAW solidly mounted resonator (SMR), or a film bulk acoustic resonator (FBAR)), the thickness of the ScAlN film 220 will have an impact on the resonant frequency of the device.

Figure 3:
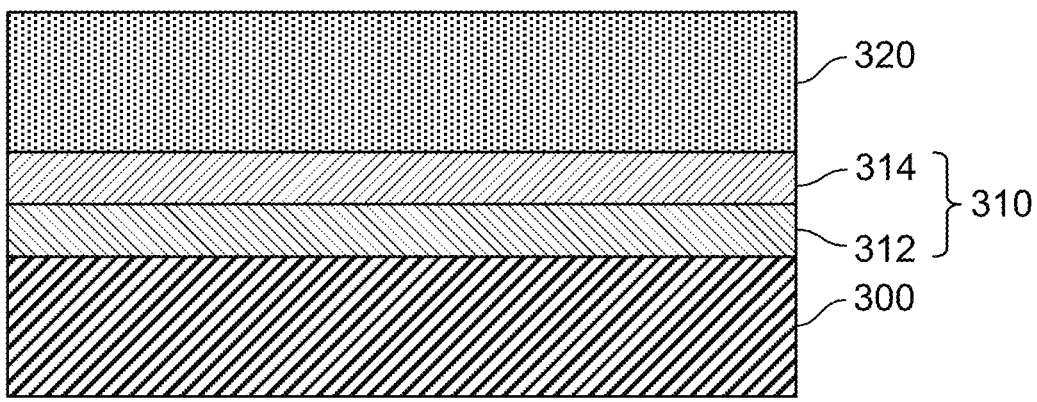
FIG. 3 illustrates an embodiment of the present invention having a double-layer metal stack template.

FIG. 3 illustrates a double-layer metal stack template 310 formed on a substrate 300. A ScAlN film 320 is formed on a template surface of the double-layer metal stack template 310.

The substrate 300 may be any suitable substrate, including the various example substrates described with respect to substrate 200.

The double-layer metal stack 310 is formed of a layer of Ti 312 and a layer of AlCu 314. The layer of Ti 312 is preferably deposited by an IMP process, producing the desired hexagonal Ti with a {002} orientation. The layer of AlCu 314 is preferably deposited by PVD, and more preferably by DC sputtering, producing the desired FCC AlCu with a {111} orientation. If sputtering is used to form the layer of AlCu 314, the preferred process parameters for this sputtering process are a 30-50 sccm flow rate of Ar gas, 9 kW DC power, and a 3 mTorr chamber pressure at 20° C. in conjunction with an AlCu alloyed target. While the preferred composition of the AlCu alloyed target is 0.5 wt % Cu, other Cu percentages may be employed, including 0 wt %, as the Cu content has little to no effect on the templating function of the double-layer metal stack 310 (it is primarily present for electromigration purposes). As described in the working examples below, growing both the layer of Ti 312 and the layer of AlCu 314 in the same deposition tool without breaking vacuum allows the layer of AlCu 314 to be more highly oriented.

The double-layer metal stack 310 may, in certain embodiments of the present invention, have the layer of Ti 312 replaced by a layer of BCC Mo with a {110} orientation, hexagonal Sc with a {002} orientation, cubic TaN with a {111} orientation, cubic NbN with a {111} orientation, or cubic $Al_3$Sc with a {111} orientation. As noted above, a sub-template layer (not illustrated) may preferably be employed, for example, the BCC Mo with a {110} orientation may preferably employ a Ti sub-template layer.

The double-layer metal stack 310 and its constituent layer of Ti 312 and layer of AlCu 314, may have any suitable thicknesses. In a preferred embodiment, the layer of Ti 312 has a preferred thickness of approximately 20 nm, though thicknesses from 20 nm to 250 nm, may be employed in alternative embodiments. In a preferred embodiment, the layer of AlCu 314 has a preferred thickness of approximately 50 nm to approximately 100 nm, though thicknesses from 20 nm to 2000 nm, may be employed in alternative embodiments. A thinner layer of AlCu 314 offers the benefit of having a parameter to tune the stress of the layer of AlCu 314 since AlCu can be subject to hillock formation. Conversely, a thicker layer of AlCu 314 offers the benefit of a more robust metal connection that does not experience large changes in micro- and macro-stress during subsequent heat treatment, such as when the ScAlN film 320 is deposited. As with the single-layer metal stack embodiment, the primary driver in selecting the deposition methods of, and the thicknesses for, the layer of Ti 312 and the layer of AlCu 314 is the need to have a highly textured hexagonal {002} oriented template.

Overall, the combination of a hexagonal {002} oriented lower metal layer and a cubic {111} oriented upper metal layer results in the desired double-layer metal stack 310 for subsequent growth of the ScAlN film 320. When the hexagonal lower metal layer is Ti, for example, in combination with a cubic upper metal layer Mo or NbN, the mismatch is relatively moderate at less than approximately 7%. By employing, for example, Sc, as the hexagonal lower metal layer, the tolerable mismatch may approach 14% for Sc/Al$_3$Sc and Sc/AlCu.

The ScAlN film 320 may have any suitable Sc composition from 0% to approximately 44%. The ScAlN film 320 is preferably deposited by reactive sputtering with N$_2$ and Ar as the process gases using either a single alloyed ScAl target or by co-sputtering using separate Sc and Al targets. The ScAlN film 320 may have any suitable thickness. In a preferred embodiment, the ScAlN film 320 has a thickness of approximately 750 nm, though thicknesses from 150 nm to 2 μm may be employed in alternative embodiments. The desired thickness of the ScAlN film 320 is a function of the final device type (e.g., BAW CMR, BAW SMR, or FBAR).

Figure 4:
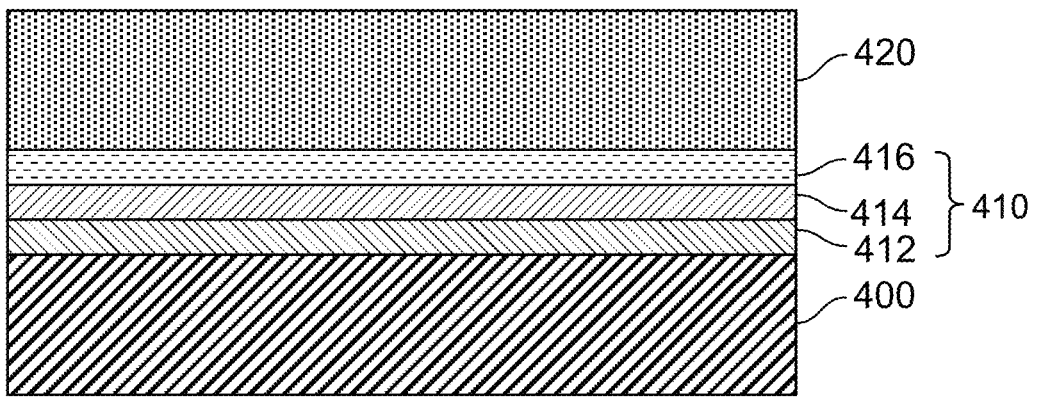
FIG. 4 illustrates an embodiment of the present invention having a triple-layer metal stack template.

FIG. 4 illustrates a triple-layer metal stack template 410 formed on a substrate 400. A ScAlN film 420 is formed on a template surface of the triple-layer metal stack template 410.

The substrate 400 may be any suitable substrate, including the various example substrates described with respect to substrate 200.

The triple-layer metal stack 410 is formed of a layer of Ti 412, a layer of TiN 414, and a layer of AlCu 416. The layer of Ti 412 is preferably deposited by an IMP process, producing the desired hexagonal Ti with a {002} orientation. The layer of TiN 414 is preferably deposited by PVD, and more preferably by sputtering, though CVD may be used, to produce the desired cubic TiN with a {111} orientation. If sputtering is used to form the layer of TiN 414, the preferred process parameters for this sputtering process are a 90-140 sccm flow rate of Ar gas, 8 kW DC power, and a 4.3 mTorr chamber pressure at 20° C. in conjunction with a TiN target. The layer of AlCu 416 is preferably deposited by sputtering, with a preferred composition of the AlCu alloyed target of 0.5% Cu, producing the desired FCC AlCu with a {111} orientation.

The triple-layer metal stack 410 may, in certain embodiments of the present invention, have the layer of Ti 412 replaced by a layer of BCC Mo with a {110} orientation, hexagonal Sc with a {002} orientation, cubic TaN with a {111} orientation, cubic NbN with a {111} orientation, or cubic Al$_3$Sc with a {111} orientation. As noted above, a sub-template layer (not illustrated) may preferably be employed, for example, the BCC Mo with a {110} orientation may preferably employ a Ti sub-template layer.

The triple-layer metal stack 410 and its constituent layer of Ti 412, layer of TiN 414, and layer of AlCu 416, may have any suitable thicknesses. In a preferred embodiment, the layer of Ti 412 has a preferred thickness of approximately 20 nm, though thicknesses from 20 nm to 250 nm, may be employed in alternative embodiments. In a preferred embodiment, the layer of AlCu 416 has a preferred thickness of approximately 50 nm to approximately 100 nm, though thicknesses from 20 nm to 2000 nm, may be employed in alternative embodiments.

In a preferred embodiment, the layer of TiN 414 has a preferred thickness of approximately 50 nm, though thicknesses from 10 nm to 100 nm, may be employed in alternative embodiments. Inclusion of the layer of TiN 414 can be beneficial in that it prevents diffusion between the substrate 400 if it is Si and Al in the AlCu layer 416. See H. Norstrom et al., Limitation of Ti/TiN diffusion barrier layers in silicon technology, Vacuum, vol. 35, no. 12, pp. 547-553 (1985), the contents of which are herein incorporated by reference. The reaction between the substrate 400, if it is Si, and Al in the AlCu layer 416 can be further slowed when the substrate 400 includes a SiO$_2$ layer on its surface or with an oxidized TiN surface. See G. Gagnon et al., Effect of the oxidation of TiN on the stability of the Al/TiN interface, Journal of Applied Physics, vol. 80, no. 1, pp. 188-195 (1996), the contents of which are herein incorporated by reference.

As with the single-layer and double-layer metal stack embodiments, the primary driver in selecting the deposition methods of, and the thicknesses for, the layer of Ti 412, the layer of TiN 414, and the layer of AlCu 416 is the need to provide a suitable template for the subsequent highly textured hexagonal {002} oriented ScAlN film 420. The deposition methods and layer thicknesses should be selected, in part, to compensate for the stress in each layer, especially as the layer of AlCu 416 is susceptible to forming hillocks if it is highly stressed.

The ScAlN film 420 may have any suitable Sc composition from 0% to approximately 44%. The ScAlN film 420 is preferably deposited by reactive sputtering with N$_2$ and Ar as the process gases using either a single alloyed ScAl target or by co-sputtering using separate Sc and Al targets. The ScAlN film 420 may have any suitable thickness. In a preferred embodiment, the ScAlN film 420 has a thickness of approximately 750 nm, though thicknesses from 200 nm to 2 μm may be employed in alternative embodiments. The desired thickness of the ScAlN film 420 is a function of the final device type (e.g., BAW CMR, BAW SMR, or FBAR).

In summary, the appropriate metal stack can be achieved through a combination of hexagonal {002} and cubic {111} metal layers in their correct orientation and specific lattice parameters. Example metal stacks include, but are not limited to, hexagonal {002}, cubic{111}, hexagonal {002}/cubic {111}, cubic {111}/hexagonal {002}, hexagonal {002}/cubic {111}/cubic {111}, hexagonal {002}/cubic {111}/hexagonal {002}, and cubic {111}/hexagonal {002}/cubic {111}. The lattice mismatch can be calculated between each metal layer and be used to target a specific material that can yield the proper template for ScAlN deposition with the criteria listed in Table 1 (above), depending on the ScAlN composition. Table 2 and Table 3 (below), report the unit cell parameters for having a cubic {111}/hexagonal {002} and a hexagonal {002}/cubic {111} metal stack, respectively. As an example based upon Table 2, if one wanted a lattice mismatch of no more than 2% for a cubic {111} metal relative to AlN, and the cubic {111} metal is on a hexagonal {002} metal, for a lattice mismatch of no more than 12% between the cubic {111} metal layer and the hexagonal {002} metal layer, the lower hexagonal {002} metal layer would need a lattice parameter an between 2.7224 Å and 3.4648 Å.

TABLE 2

Lattice parameters of the cubic and hexagonal metal layers needed to create a metal template with the cubic layer terminating.

| Lattice Mismatch to | 2% | | | | 6% | | | | 12% | | | |
|---|---|---|---|---|---|---|---|---|---|---|---|---|
| $Sc_xAl_{1-x}RN$ | Positive | | Negative | | Positive | | Negative | | Positive | | Negative | |
| $a_c$ {111} (Å) needed for $Sc_xAl_{1-x}N$ template at x = 0 & 0.44 | 4.3120 | 4.7140 | 4.4880 | 4.9065 | 4.1492 | 4.5362 | 4.6789 | 5.1152 | 3.9270 | 4.2931 | 4.9980 | 5.4640 |
| $a_h$ {002} (Å) needed for ≤\|12%\| mismatch to {111} cubic layer | 2.7224-3.4648 | 2.9762-3.7878 | 2.8335-3.6062 | 3.0977-3.9425 | 2.6196-3.3340 | 2.8639-3.6450 | 2.9540-3.7596 | 3.2295-4.1102 | 2.4793-3.1555 | 2.7104-3.4496 | 3.1555-4.0160 | 3.4497-4.3905 |

For $a_c$ {111}/$a_h$ {002}, i.e. a cubic {111} metal layer on top of a hexagonal {002} layer.

TABLE 3

Lattice parameters of the hexagonal and cubic metal layers needed to create a metal template with the hexagonal layer terminating.

| Lattice Mismatch to | 2% | | | | 6% | | | | 12% | | | |
|---|---|---|---|---|---|---|---|---|---|---|---|---|
| $Sc_xAl_{1-x}N$ | Positive | | Negative | | Positive | | Negative | | Positive | | Negative | |
| $a_h$ {002} (Å) needed for $Sc_xAl_{1-x}N$ template at x = & 0.44 | 3.0490 | 3.3333 | 3.1735 | 3.4694 | 2.9340 | 3.2075 | 3.3085 | 3.6170 | 2.7768 | 3.0357 | 3.5341 | 3.8636 |
| $a_c$ {111} (Å) needed for ≤\|12%\| mismatch to {002} hexagonal layer | 3.8499-4.8999 | 4.2089-5.3568 | 4.0071-5.1000 | 4.3808-5.5755 | 3.7047-4.7151 | 4.0501-5.1546 | 4.1776-5.3170 | 4.5672-5.8127 | 3.5062-4.4625 | 3.8332-4.8786 | 4.4625-5.6795 | 4.8785-6.2090 |

For $a_h$ {002}/$a_c$ {111}, i.e. a hexagonal {002} metal layer on top of a cubic {111} layer.

WORKING EXAMPLES

The following discussion provides results from experiments exploring the use of single-double-, and triple-layer metal stacks of various compositions and thicknesses and their impact on the structure of AlN, $Sc_{0.125}Al_{0.875}N$, and $Sc_{0.2}Al_{0.8}N$ films. As all of the AlCu layers in the experiments had a composition of $Al_{0.995}Cu_{0.005}$, i.e., 0.5 wt % Cu, this will be abbreviated as AlCu.

Figure 5:
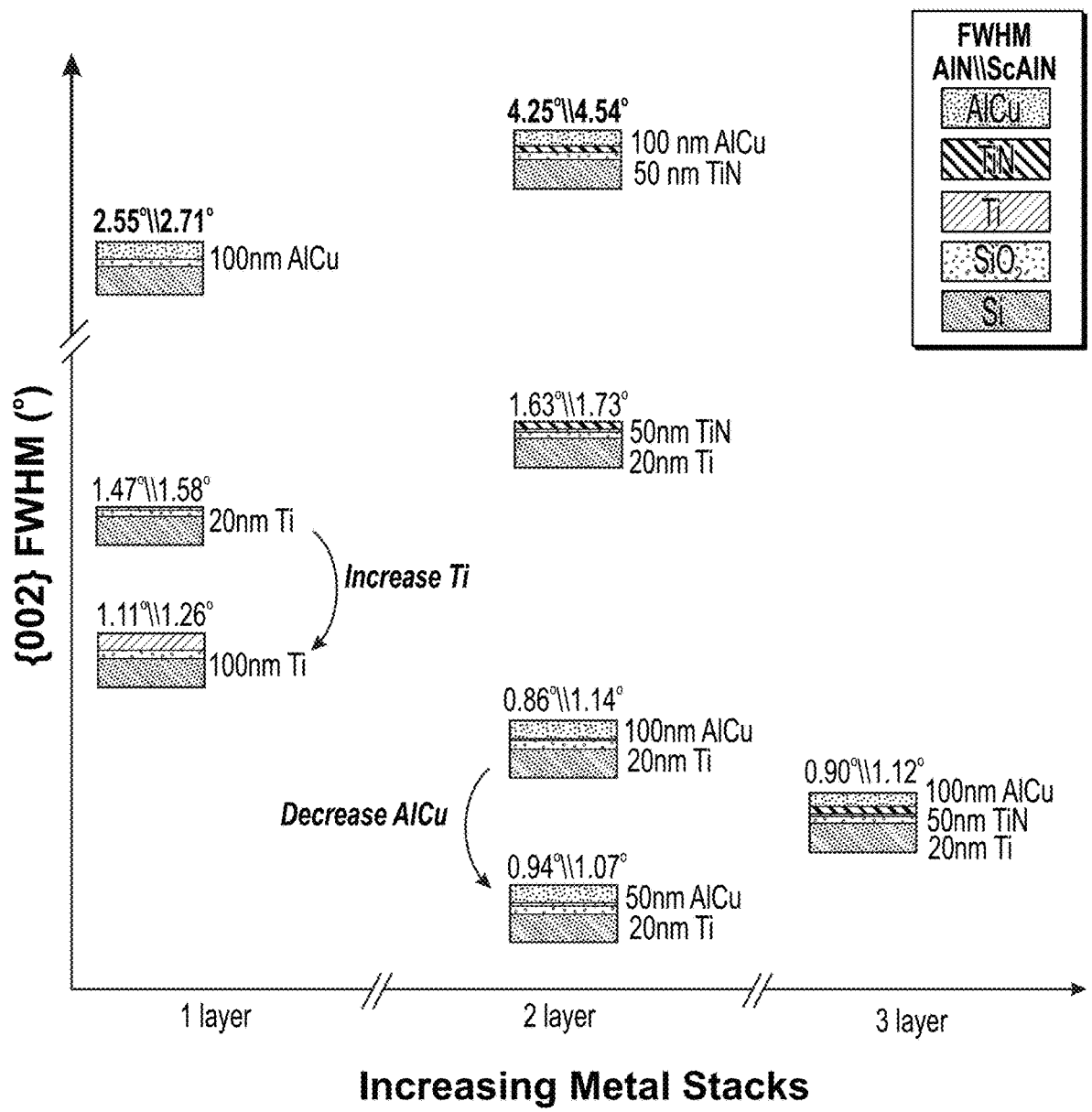
FIG. 5 illustrates the FWHM XRD values for AlN and ScAlN films grown on various embodiments of the present invention.

Single- double-, and triple-layer metal stacks were used for templating c-axis texture for $Sc_{0.125}Al_{0.875}N$ and $Sc_{0.2}Al_{0.8}N$ films. FIG. 5 summarizes all the unique CMOS-compatible metal stacks that were explored as options for the AlN and $Sc_{0.125}Al_{0.875}N$ films. In FIG. 5, each data point provides the full width at half maximum (FWHM) for both the AlN and $Sc_{0.125}Al_{0.875}N$ films as determined by X-ray diffraction (XRD) in the {002} crystal direction. Each column of data from left to right in FIG. 5 represents an increase in the number of metal layers within the metal stack. For purposes of comparison, the FWHM value for a 750 nm thick layer of AlN or $Sc_{0.125}Al_{0.875}N$ grown directly on a silicon wafer is 1.90°. See Y. Lu et al. and M. D. Henry et al.

Both Ti and AlCu layers were explored as single-layer metal stacks. Using AlCu lead to a FWHM of 2.55°\\2.71° for AlN\\$Sc_{0.125}Al_{0.875}N$ films, respectively. Preferably, the FWHM value should be approximately 1.5° or less to enhance the magnitude of the piezoelectric coefficient for ScAlN films over that of a highly c-axis textured AlN film. See H. P. Loebl et al., Piezoelectric thin AlN films for bulk acoustic wave (BAW) resonators, Materials Chemistry and Physics, vol. 79, no. 2-3, pp. 143-146 (2003), the contents of which are herein incorporated by reference. Using a Ti layer lead to a significant improvement over the AlCu layer with corresponding FWHM values of 1.47°\\1.58°. Increasing the thickness of the Ti layer from 20 nm to 100 nm lead to an even further improvement in texture with FWHM values of 1.11°\\1.26°. For $Sc_{0.2}Al_{0.8}N$, the FWHM value was 1.42° for a film grown on a 100 nm thick single-layer metal stack of Ti. These results show that depositing AlN and ScAlN films on a Ti layer can yield high c-axis orientation, and creates an additional electrode option during device design.

The double- and triple-layer metal stacks showed significant improvement in the texture of the AlN and ScAlN relative to a Ti single-layer metal stack when using a Ti layer as the first layer. Using a Ti layer as the first layer, as shown by the Ti/TiN data point on FIG. 5, improved the texture to 1.63°\\1.73° compared to the AlCu single-layer metal stack and the TiN/AlCu double-layer metal stack. The advantages of using a Ti layer as the first layer is also shown by the results of Ti/AlCu double-layer metal stack, which resulted in FWHM values of 0.86°\\1.14°. The corresponding value for $Sc_{0.2}Al_{0.8}N$ on the Ti (20 nm)/AlCu (100 nm) double-layer metal stack is 1.30°. Reducing the thickness of the AlCu layer from 100 nm to 50 nm in the double-layer metal stack of Ti/AlCu resulted in a slight improvement in the FWHM of the ScAlN film from 1.14° to 1.07°. The triple-layer metal layer stack of Ti/TiN/AlCu lead to a FWHM value of 0.9°\\1.12°, which is similar to the Ti/AlCu double-layer metal stack, making the Ti/AlCu double-layer and Ti/TiN/AlCu triple-layer metal stacks the best performing metal stacks. This is also generally true for $Sc_{0.2}Al_{0.8}N$, as its FWHM was 1.11° on the Ti/TiN/AlCu triple-layer metal stack.

The results of the Ti/AlCu double-layer metal stack show two notable features. First, the TiN layer is not required to create highly-textured AlN or ScAlN films, and may thus be optional for certain devices. Second, decreasing the TiN layer thickness resulted in a lower FWHM for AlN films. Table 4 provides evidence for both statements by showing the FWHM of the AlN and ScAlN films when the thickness of the TiN layer is varied in the Ti/TiN/AlCu triple-layer metal stack. Specifically, a reduction in the TiN layer thickness from 50 nm to 20 nm resulted in a greater than 0.06° reduction in the FWHM for AlN films. The ability to deposit highly-oriented c-axis AlN and ScAlN films is attributed to the use of textured Ti and AlCu, with the use of TiN having a relatively smaller impact.

TABLE 4

FWHM for AlN and ScAlN deposited on various metal stacks.

| Metal Stack on 1 μm $SiO_2$ | AlN FWHM | $Sc_{0.125}Al_{0.875}N$ FWHM | $Sc_{0.2}Al_{0.8}N$ FWHM |
|---|---|---|---|
| 20 nm Ti/50 nm TiN/100 nm AlCu | 0.897° | 1.122° | 1.11° |
| 100 nm Ti/50 nm TiN/100 nm AlCu | 0.877° | 1.095° | |
| 20 nm Ti/20 nm TiN/100 nm AlCu | 0.830° | 1.105° | |
| 20 nm Ti/100 nm TiN/100 nm AlCu | 0.923° | 1.148° | |
| 100 nm Ti | 1.110° | 1.265° | 1.42° |
| 20 nm Ti/100 nm AlCu | 0.861° | 1.140° | 1.30° |
| 100 nm Ti/100 nm AlCu | 0.841° | 1.124° | |

Figure 6:
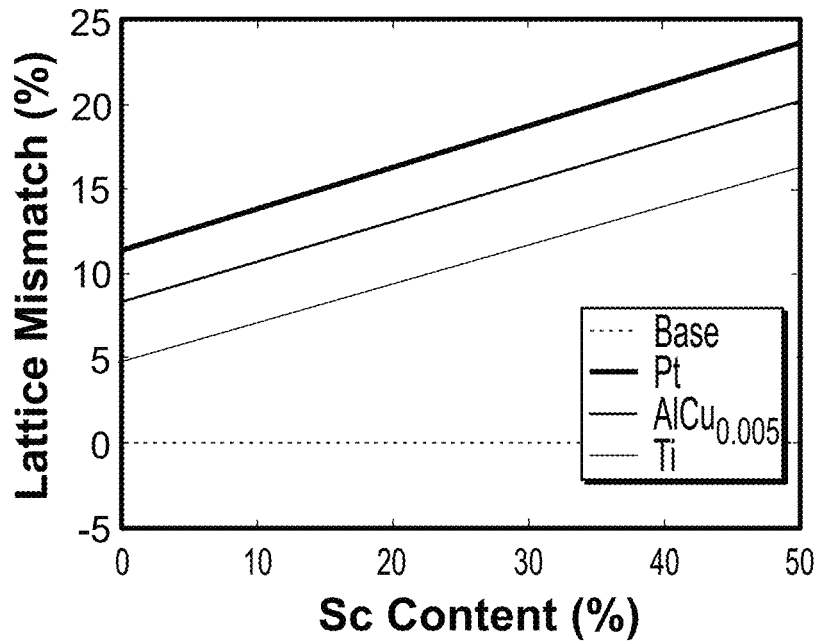
FIG. 6 illustrates the lattice mismatch between various metal layers and ScAlN as a function of Sc content.

The improvement due to the use of an AlCu layer, when deposited on a Ti layer or a Ti/TiN double layer, as a template for highly-textured ScAlN films can be attributed to its face-centered cubic (FCC) crystal structure. FCC crystals show hexagonal symmetry along the {111} direction and can be used for template matching to hexagonal ScAlN films if their lattice mismatch is small enough. AlCu and Pt have similar lattice parameters of 4.037 Å and 3.924 Å, respectively, and both are FCC metals. The lattice mismatch ($\varepsilon_m$) between AlCu and AlN can be calculated using $\varepsilon_m = (2a_h - a_c\sqrt{2})/a_c\sqrt{2}$ where $a_h$ is the lattice parameter of the hexagonal crystal structure ($a_h$=3.11 Å for AlN) and $a_c$ is the lattice parameter of FCC AlCu (4.037 Å). As shown in FIG. 6, the lattice mismatch of AlCu and Pt to various compositions of ScAlN favors AlCu by approximately 2%, which can aid in the deposition of higher textured ScAlN films when highly textured {111} AlCu layers are used.

The presence of a native oxide layer on the surface of a metal stack can obfuscate the effectiveness of the metal stack as a template. Although a soft etch sputter step was not used in the experiments before depositing the AlN and ScAlN films, indicating that a native oxide layer is expected on the surface of the metal stack, the metal stacks used in the experiments show encouraging results for use as templates. Given the success of the metal stacks, the native oxide layer may have been reduced during sputter deposition due to the energetic bombardment of precursors on the surface of the metal stack, which can cause the oxide bonds to break or drive oxygen into the metal stack. In addition to, or in the alternative, the native oxide layer may be ordered due to the highly oriented nature of the underlying metal stack.

Figure 7:
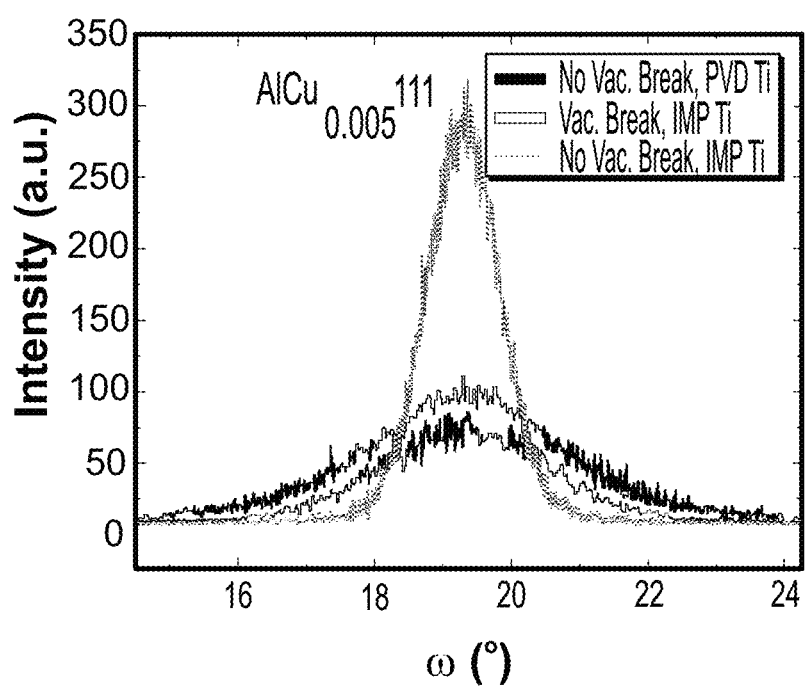
FIG. 7 illustrates the FWHM XRD values of a triple-layer metal stack embodiment of the present invention formed by three different growth techniques.

To deposit highly-textured AlN and ScAlN films, well-oriented {111} AlCu layers are needed. AlCu is very dependent upon processing conditions and the texture quality of the underlying material stack. To explore this, three different metal stacks with top AlCu layers were fabricated. For the first sample, the entire Ti/TiN/AlCu triple-layer metal stack was grown in the same chamber without breaking vacuum, i.e., under continuous vacuum conditions, and the Ti layer was deposited by IMP. For the second sample, the same Ti/TiN/AlCu triple-layer metal stack was used, but a vacuum break was introduced before growth of the AlCu layer, which mimics a fabrication scenario in which the entire Ti/TiN/AlCu triple-layer metal stack cannot be deposited in a single deposition tool. For the third sample, the same Ti/TiN/AlCu triple-layer metal stack was deposited without breaking vacuum, i.e., under continuous vacuum conditions, but the Ti layer was deposited by a PVD process instead of the preferred IMP process. In all three cases the thicknesses of the Ti, TiN, and AlCu layers were 20 nm, 50 nm, and 100 nm, respectively. FIG. 7 shows the FWHM of the AlCu {111} for all three samples, with the first sample showing the best results. The second sample showed a large FWHM that can be attributed to the formation of a native oxide during the vacuum break. Comparing the first and third samples showed that using IMP Ti leads to a significant improvement in {111} AlCu texture.

The experiment also showed that a hexagonal {002} Ti layer provides a suitable template for AlN and ScAlN growth. Given the similarity between the hexagonal crystal structure of Ti and both AlN and ScAlN, the mismatch between the two basal planes can be compared based on their lattice parameter $a_h$. Comparing Ti ($a_h$=2.95 Å) and AlN, the lattice mismatch between the two crystal structures is approximately 5%, as shown in FIG. 6. To take advantage of the lower lattice mismatch, a highly-textured {002} hexagonal Ti layer is needed. A primary reason for the use of IMP Ti over traditional PVD Ti is the texture quality obtained from IMP Ti (2.28° F.WHM vs. 2.81° FWHM), when deposited on a substrate having a top 1 μm $SiO_2$ layer.

Figure 8:
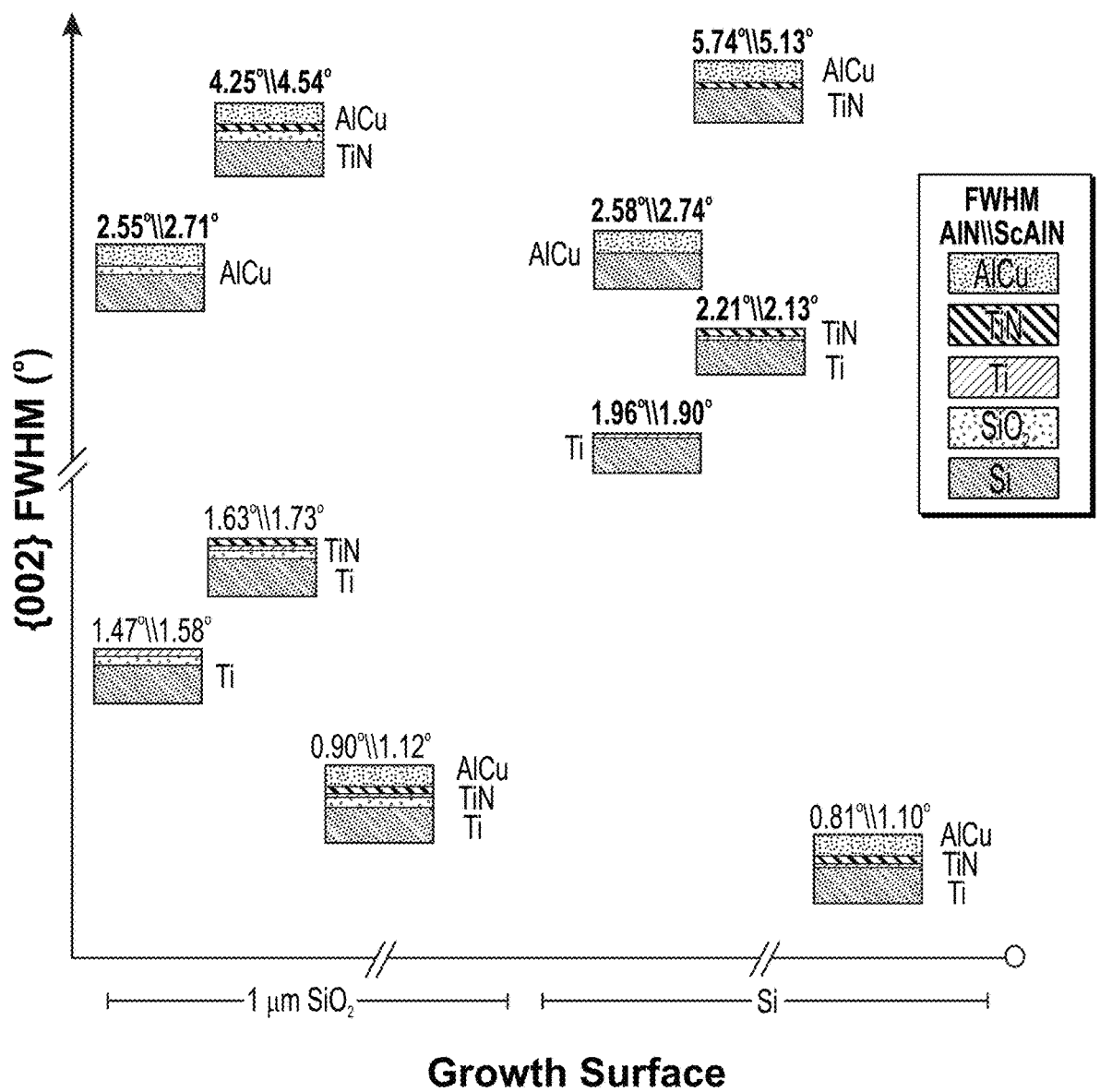
FIG. 8 illustrates the FWHM XRD values for AlN and ScAlN films grown on various embodiments of the present invention, which were deposited directly on Si substrates or on a 1 µm thick $SiO_2$ layer.

Depositing a metal layer on $SiO_2$ generally improves the texture of the metal layer, however, including a $SiO_2$ layer on the surface of the substrate is a performance tradeoff between thermal compensation of frequency and resonator performance. See Piezoelectric MEMS Resonators, H. Bhurga and G. Harmeet eds., Springer (2017), the contents of which are herein incorporated by reference. A control set of metal stacks was chosen to examine any improvement in metal deposition quality gained from depositing on a $SiO_2$ layer versus depositing directly on a Si substrate. These results are summarized in FIG. 8, where the red y-axis values denote FWHM values that are greater than growing 750 nm thick AlN and $Sc_{0.125}Al_{0.875}N$ layers directly on a Si substrate, i.e., greater than >1.90°, while the green FWHM values are less than 1.90°. The thicknesses for the Ti, TiN, and AlCu layers in this study were 20 nm, 50 nm, and 100 nm, respectively.

In two cases, the metal stacks generally yielded a better texture quality when deposited on a $SiO_2$ layer compared to when they were deposited directly on the Si substrate. For example, when the TiN/AlCu double-layer metal stack was deposited on a $SiO_2$ layer followed by growth of AlN or $Sc_{0.125}Al_{0.875}N$ films, the FWHM decreased to 4.25°\\4.54° from 5.74°\\5.13°, the FWHM obtained when the TiN/AlCu double-layer metal stack was deposited directly on a Si substrate. Depositing a Ti single-layer metal stack on a $SiO_2$ layer, as compared to directly on a Si substrate similarly lead to a sizeable decrease in FWHM from 1.96°\\1.90° to 1.47°\\1.58° for the AlN and $Sc_{0.125}Al_{0.875}N$ films, respectively. The two metal stacks that did not gain an improvement in texture when deposited on a $SiO_2$ layer are the single-layer metal stack of AlCu and the triple-layer metal stack of Ti/TiN/AlCu. Depositing the AlCu single-layer metal stack on a $SiO_2$ layer as compared to directly on a Si substrate lead to a 0.03° difference in FWHM. Depositing the Ti/TiN/AlCu triple-layer metal stack directly on a Si substrate lead to the best FWHM of 0.81°\\1.10° for the AlN and $Sc_{0.125}Al_{0.875}N$ films, respectively, which is very similar to when the Ti/TiN/AlCu triple-layer metal stack is deposited on a 1 μm thick $SiO_2$ layer (0.90°\\1.12° for the AlN and $Sc_{0.125}Al_{0.875}N$ films, respectively). This suggests that the $SiO_2$ layer is not needed when using the Ti/TiN/AlCu triple-layer metal stack for depositing highly-textured ScAlN films.

For samples deposited directly on a Si substrate, an intermetallic layer may form, which can affect the performance of ScAlN-based piezoelectric applications. The diffusion between Ti—Si has been well-documented in the literature, which reports that $TiSi_2$ is the most stable intermetallic at temperatures above 500° C. See L. S. Hung et al., Kinetics of $TiSi_2$ formation by thin Ti films on Si, Journal of Applied Physics, vol. 54, no. 9, pp. 5076-5080 (1983), the contents of which are hereby incorporated by reference. Note that Ti and Si begin diffusing between 300-400° C., i.e., before formation of this silicide. See R. J. Nemanich et al., Raman-Scattering Characterization of Titanium Silicide Formation, IEEE Journal of Quantum Electronics, vol. 25, no. 5, pp. 997-1002 (1989), the contents of which are hereby incorporated by reference.

Figure 9A:
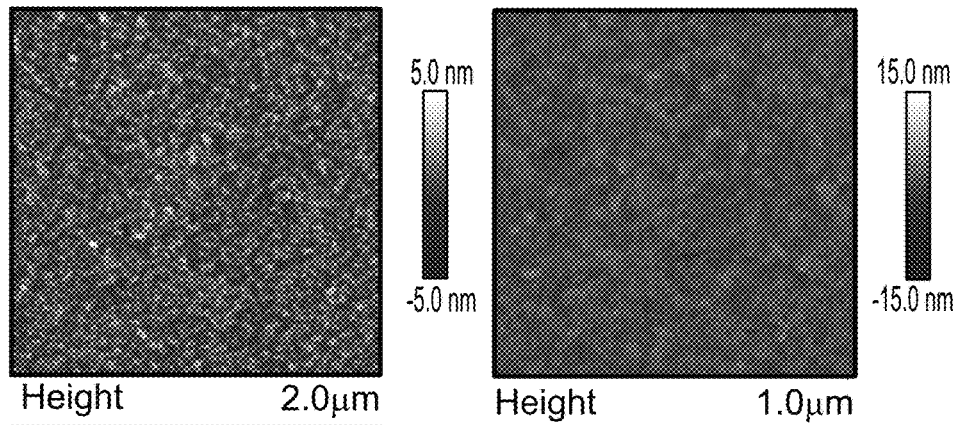
FIGS. 9A-9C illustrate atomic force microscopy (AFM) results for ScAlN films grown on various embodiments of the present invention deposited directly on Si substrates.
Figure 9B:
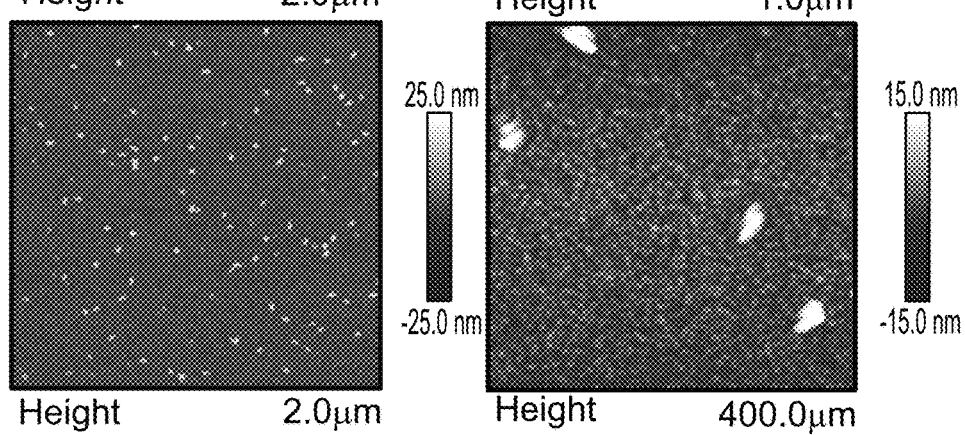
Figure 9C:
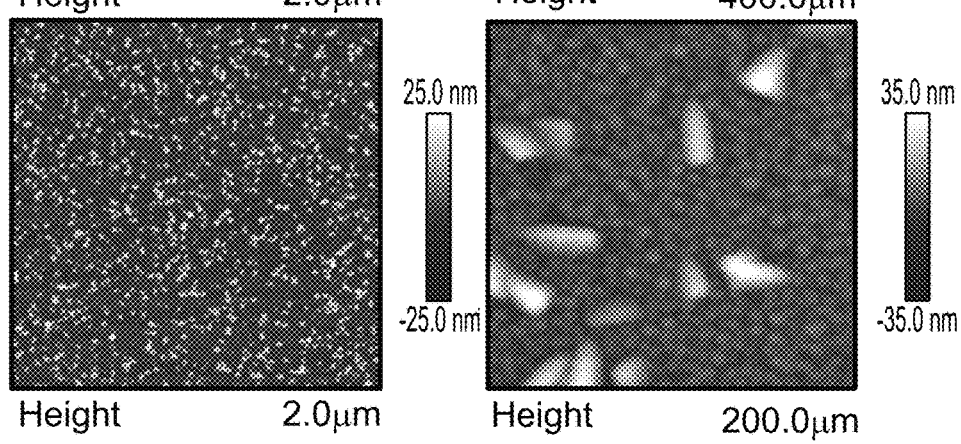
Figure 10:
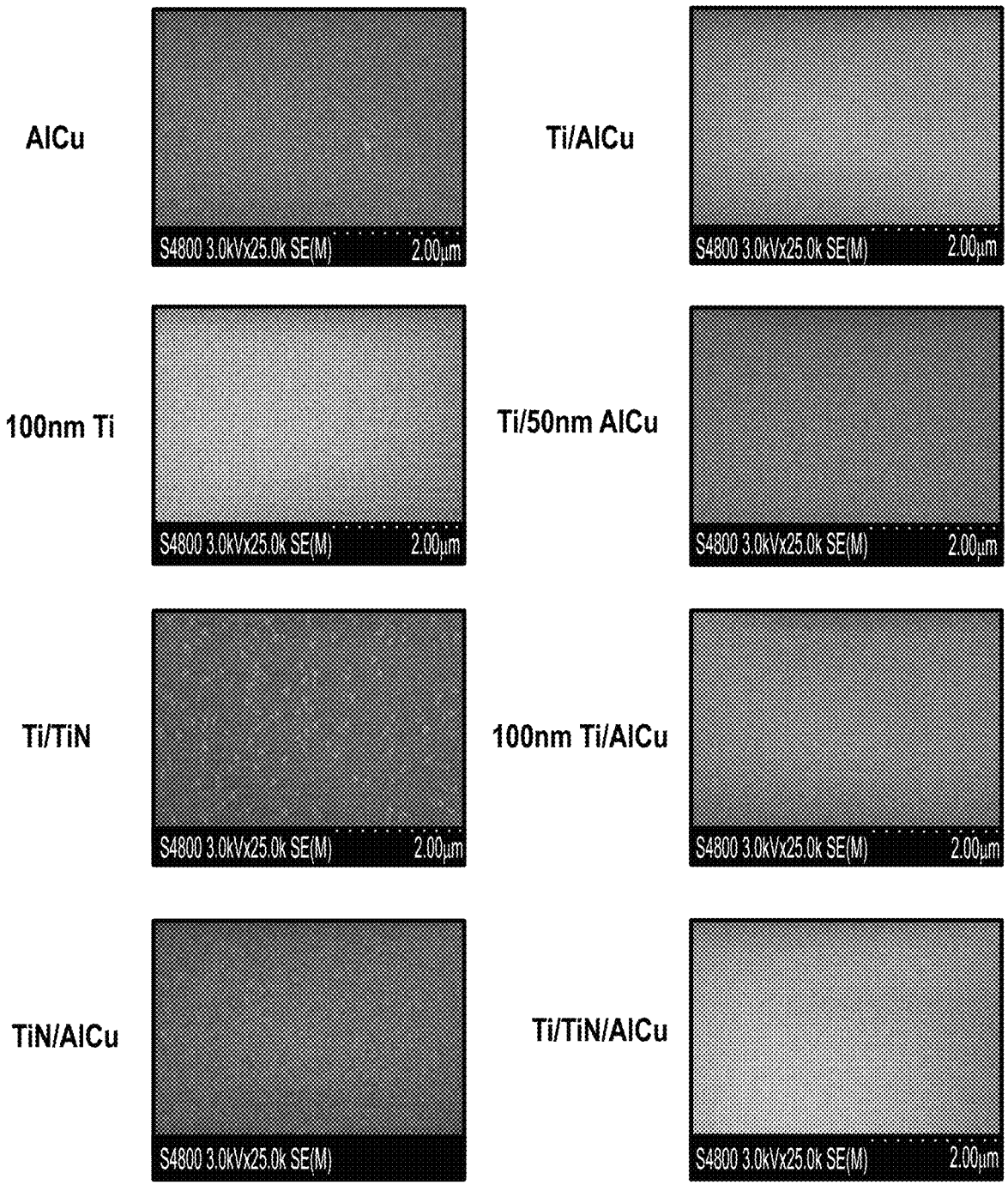
FIG. 10 illustrates scanning electron microscopy (SEM) images of ScAlN films grown on various embodiments of the present invention, which were deposited directly on a 1 µm thick $SiO_2$ layer.

The use of a Ti/TiN/AlCu triple-layer metal stack as a template for film growth has suppressed SG formation in $Sc_{0.125}Al_{0.875}N$ films. FIG. 9A shows atomic force microscope (AFM) results for $Sc_{0.125}Al_{0.875}N$ films on a Ti/TiN/AlCu triple-layer metal stack deposited directly on a Si substrate. No SG can be seen in the 100 μm² and 25 μm² areas shown in these AFM images. Conversely, for $Sc_{0.125}Al_{0.875}N$ films deposited on Ti and Ti/TiN metal stacks exhibited numerous SG, shown in FIGS. 9B and 9C, respectively, with the Ti/TiN double-layer metal stack resulting in the highest density of SG. While the AFM images shown in FIGS. 9A-9C are for metal stacks deposited directly on a Si substrate, those deposited on a $SiO_2$ layer yielded similar results, except for the case of the Ti single-layer metal stack. FIG. 10 shows SEM images of $Sc_{0.125}Al_{0.875}N$ films deposited on various metal stacks grown on 1 μm thick $SiO_2$ layers, which further reinforces the usefulness of a Ti/TiN/AlCu triple-layer metal stack in suppressing the formation of SG.

Figure 11A:
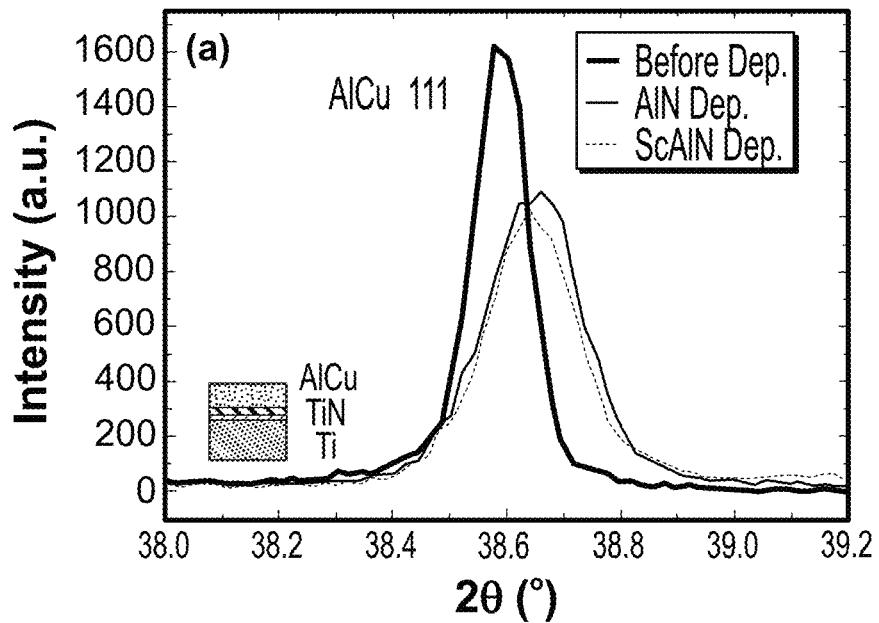
FIGS. 11A and 11B illustrate the FWHM XRD values for the AlCu layer and Ti layer of various embodiments of the present invention, respectively, before and after deposition of Al and ScAlN films.

Deposition of the ScAlN film modifies the stress and texture of any underlying Ti and AlCu layers. The deposition temperature used for crystallization of $Sc_{0.125}Al_{0.875}N$/AlN films (375° C./350° C.) subjects the AlCu layer to a heat treatment above its recrystallization temperature. Stress relaxation is therefore expected during this recrystallization, but upon subsequent cooling, the thermal strain imposed by the substrate and surrounding film stack is reintroduced into the AlCu layer. FIG. 11A shows 0-20 XRD scans of the AlCu layer before and after AlN/$Sc_{0.125}Al_{0.875}N$ film deposition, where significant broadening and shifting of the 2θ AlCu {111} reflection occurred when AlN/$Sc_{0.125}Al_{0.875}N$ layers were deposited. Both the broadening and the shifting of the AlCu {111} reflection are signs that point towards macro- and/or micro-stress in the AlCu layer. Thus, when an AlN/ScAlN film is deposited on AlCu, hillocks may be generated even though they were not present before deposition of the AlN/ScAlN film.

Figure 11B:
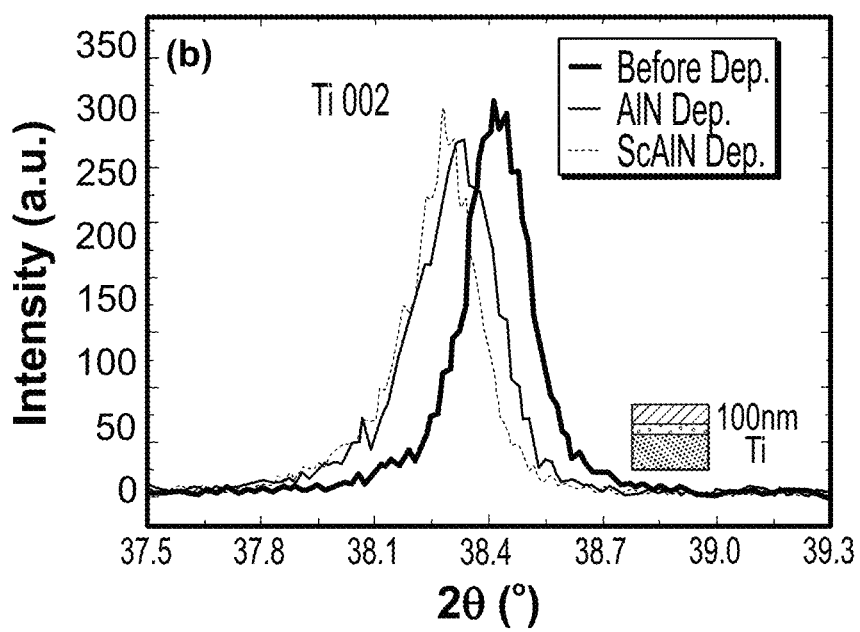

A similar trend was observed when depositing an AlN/ScAlN film on a Ti layer. A Ti layer can lead to a better microstructural stress-strain response compared to AlCu when heat treated. This is due to the plastic deformation that occurs in AlCu layers subjected to heat treatment. See P. Ekkels et al., Evaluation of platinum as a structural thin film material for RF-MEMS devices, Journal of Micromechanics and Microengineering, vol. 19, no. 6 (2009), the contents of which are hereby incorporated by reference. The FWHM of a 100 nm thick Ti layer before and after deposition of a $Sc_{0.125}Al_{0.875}N$ film were 2.28° and 2.08°, respectively. Due to the large tensile stress of the Ti layer during its deposition and its chosen thickness, deposition of an AlN/ScAlN film causes the Ti layer to relax and become less tensile. This can lead to a compressive stress imposed on the AlN/ScAlN film. This is shown in FIG. 11B by the shift to lower 2θ in the Ti {002} reflection. Thus, careful consideration must be taken when subjecting thin AlCu and Ti layers to subsequent heating processes as they can influence the stress state of the AlN/ScAlN film grown thereon.

Figure 12:
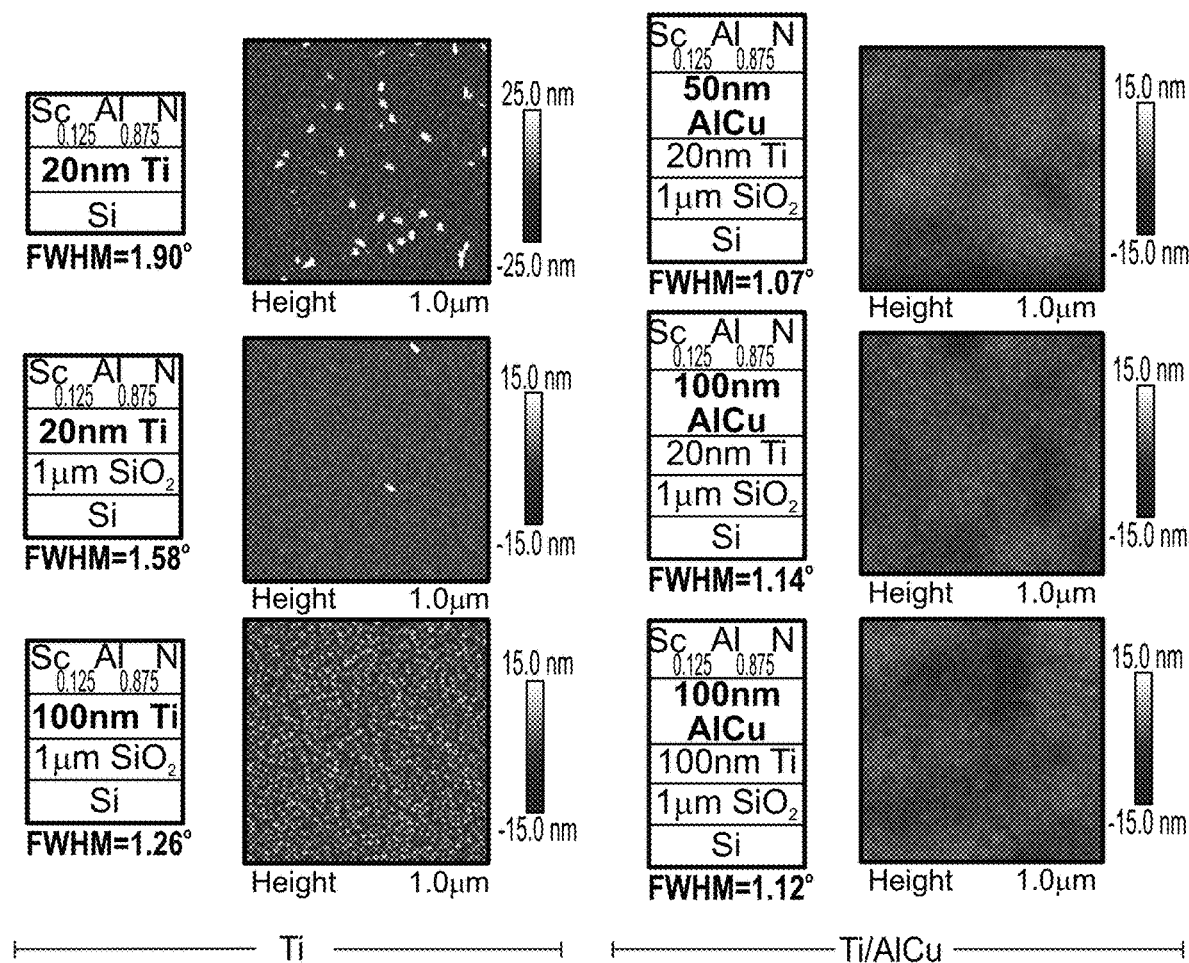
FIG. 12 illustrates the AFM results for ScAlN films grown on various embodiments of the present invention, which were deposited directly on Si substrates or on a 1 µm thick $SiO_2$ layer.
Figure 13:
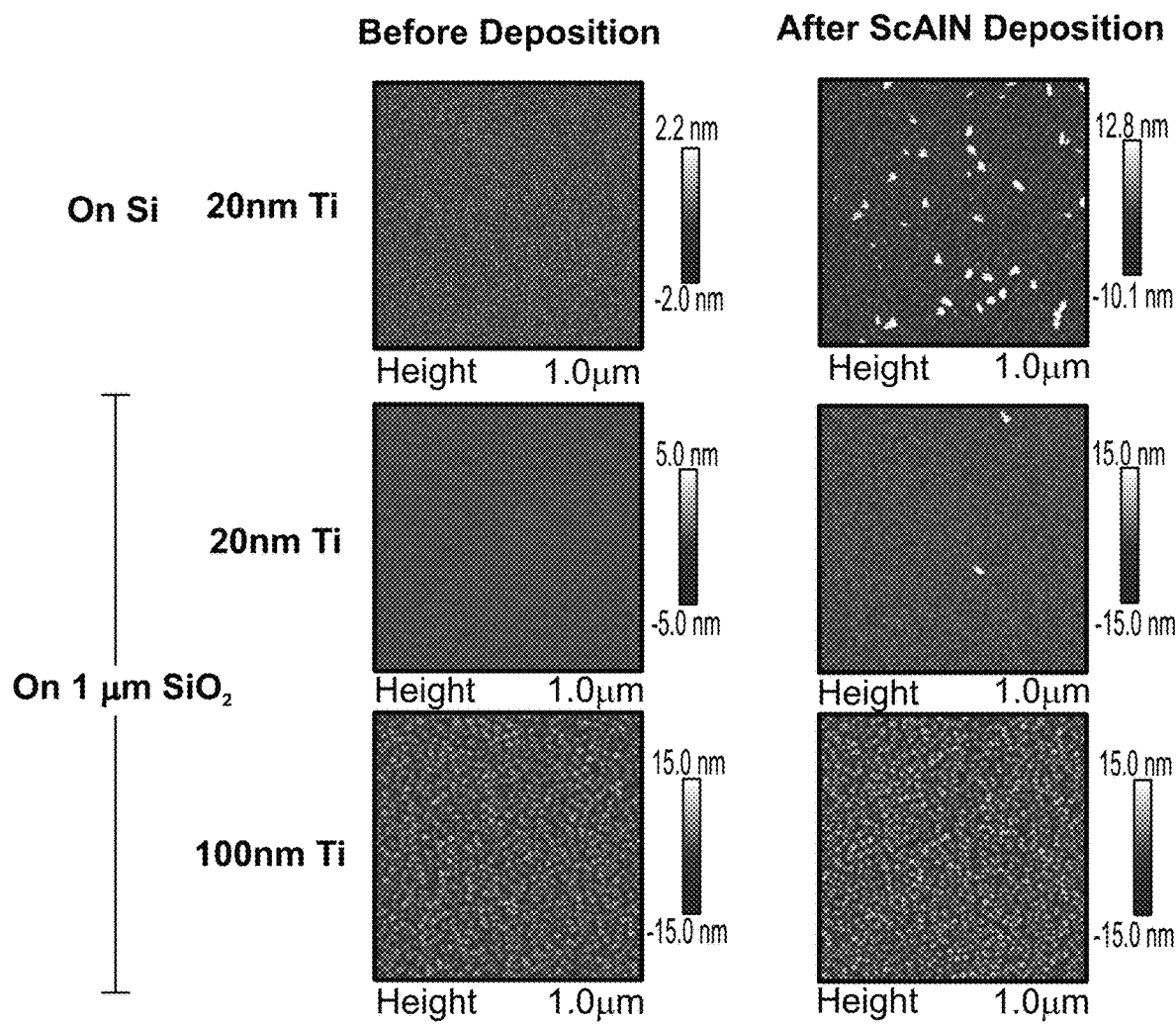
FIG. 13 illustrates the AFM results for ScAlN films grown on various embodiments of the present invention, which were deposited directly on Si substrates or on a 1 µm thick $SiO_2$ layer.

The growth of highly-textured {002} hexagonal Ti films can lead to a significant reduction in ScAlN SG. The first column in FIG. 12 shows that growing a Ti layer on a 1 μm thick $SiO_2$ layer improves its {002} texture and leads to a significant reduction in the formation of SG in the $Sc_{0.125}Al_{0.875}N$ film. Increasing the thickness of the Ti layer from 20 nm to 100 nm leads to a further improvement in texture of the $Sc_{0.125}Al_{0.875}N$ film and further suppression of SG formation. However, the microstructure of the $Sc_{0.125}Al_{0.875}N$ film on the 100 nm thick Ti layer exhibits an interesting morphology. This morphology is present in both the AlN and ScAlN cases and has been tied to the pressure used in the deposition of the Ti layer. See A. Ababneh et al., c-axis orientation and piezoelectric coefficients of AlN thin films sputter-deposited on titanium bottom electrodes, Applied Surface Science, vol. 259, pp. 59-65 (2012), the contents of which are hereby incorporated by reference. AFM images taken before and after deposition of $Sc_{0.125}Al_{0.875}N$ films are shown in FIG. 13. This cauliflower-like microstructure can result in high film roughness, with the roughness for $Sc_{0.125}Al_{0.875}N$ films on a 20 nm thick Ti layer and a 100 nm thick Ti layer measured to be 1.82 nm and 2.76 nm, respectively. To avoid the increased roughening seen with thicker Ti layers, which can lead to partial delamination at the interface between the Ti layer and the AlN/ScAlN film (see A. Ababneh et al.), a Ti/AlCu double-layer or a Ti/TiN/AlCu triple-layer metal stack can be used.

The Ti/AlCu double-layer metal stack allows for highly c-axis textured ScAlN while suppressing SG. The second column of FIG. 12 shows the microstructure of $Sc_{0.125}Al_{0.875}N$ films grown on various Ti/AlCu double-layer metal stacks. The absence of hillocks is due to the better stress compensation between the Ti and AlCu layers. At Ti thicknesses at and below 300 nm, the thermal expansion coefficient has been reported to increase as the film becomes thinner. In contrast, the same authors determined that for a pure Al layer, the thermal expansion coefficient decreases as the thickness decreases from 1.7 μm to 0.3 μm. See W. Fang and C.-Y. Lo, On the thermal expansion coefficients of thin films, Sensors and Actuators A: Physical, vol. 84, no. 3, pp. 310-314 (2000), the contents of which are hereby incorporated by reference. A study by Venkatraman and Bravman on layers of pure Al showed that a thinner layer (0.18 μm) handled plasticity better than a thicker film (0.98 μm). See R. Venkatraman and J. C. Bravman, Separation of film thickness and grain boundary strengthening effects in Al thin films on Si, Journal of Material Research, vol. 7, no. 8, pp. 2040-2048 (1992), the contents of which are hereby incorporated by reference. Therefore, through process tuning, a Ti/AlCu double-layer metal stack can be designed and grown that is stress compensated to suppress hillocks and exhibits a smooth surface which will allow for highly c-axis textured ScAlN with suppressed SG formation.

Variability across a wafer in terms of SG formation can be difficult to detect in samples that have a low density of SG. Enlarging the scan area makes it difficult to detect small SG or hillocks which tend to grow in the 100-250 nm range for Al/ScAlN films having a thickness of 750 nm. Scanning across a wafer using scanning electron microscopy (SEM) is a better method to test variability across the wafer, but is time consuming and does not guarantee accurate detection. Conducting SEM on all the unique metal stacks revealed that the following suppress formation of SG in areas greater than 100 μm². Ti single-layer, Ti/AlCu double-layer, and Ti/TiN/AlCu triple-layer metal stacks. SEM on these three samples resulted in 0-2 SG being found when scanning across multiple areas. The impact of low density SG would have on device performance is currently unknown, especially when the texture quality of the ScAlN film is high (FWHM~1.10° at 750 nm thickness).

Electrical resistivity is a key material property to consider when choosing the electrode material for micro-resonator devices. As will be appreciated by a person of ordinary skill in the art, electrodes with high electrical resistivity will cause large voltage drops and lead to lower quality (Q) factors. Table 5 summarizes the average resistivity, measured using a four-point probe, and the FWHM value for AlN and $Sc_{0.125}Al_{0.875}N$ for all the different metal stacks studied. The most noteworthy result is the decrease in resistivity measured for the Ti/AlCu double-layer metal stack compared to the Ti/TiN/AlCu triple-layer metal stack. Given its ability to suppress SG as shown in FIG. 12, and the narrow FWHM for both $Sc_{0.125}Al_{0.875}N$ and AlN films as seen in FIG. 5, the Ti/AlCu double-layer metal stack becomes an attractive bottom electrode for device design. More importantly, removing the TiN layer from the triple-layer metal stack and using a thinner overall metal stack for the bottom electrode permits the fabrication of micro-resonator devices using AlN/ScAlN technologies with potentially higher operating frequencies and higher piezoelectric constants.

TABLE 5

Average resistivity measurements of various metal stacks.

| Metal Stack on 1 μm $SiO_2$ | ρ (μΩ · cm) | AlN FWHM | $Sc_{0.125}Al_{0.875}N$ FWHM |
|---|---|---|---|
| 20 nm Ti | 88.31 | 1.47° | 1.58° |
| 20 nm Ti/50 nm TiN | 128.91 | 1.63° | 1.73° |
| 20 nm Ti/50 nm TiN/100 nm AlCu | 4.85 | 0.90° | 1.12° |
| 20 nm Ti/100 nm AlCu | 3.51 | 0.86° | 1.14° |
| 50 nm TiN/100 nm AlCu | 4.36 | 4.25° | 4.54° |
| 100 nm AlCu | 2.80 | 2.55° | 2.71° |
| 100 nm Ti | 58.95 | 1.11° | 1.26° |
| 20 nm Ti/50 nm AlCu | 3.79 | 0.94° | 1.07° |

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A piezoelectric device comprising:
a substrate;
a metal stack formed on a surface of the substrate, the metal stack comprising one or more post-CMOS process compatible metals; and
a highly textured hexagonal {002} oriented scandium aluminum nitride (ScAlN) piezoelectric film formed on a template surface of the metal stack, the metal stack adapted to provide a template for the highly textured hexagonal {002} oriented ScAlN piezoelectric film, the highly textured hexagonal {002} oriented ScAlN piezoelectric film having a composition of between aluminum nitride (AlN) and about $Sc_{0.44}Al_{0.56}N$.

2. The piezoelectric device of claim 1, wherein the substrate comprises one of a semiconductor wafer, a processed semiconductor wafer, a composite wafer, and a cavity SOI wafer.

3. The piezoelectric device of claim 1, further comprising a sub-template layer, the sub-template layer formed between the substrate and the metal stack.

4. The piezoelectric device of claim 1, wherein the metal stack comprises a single-layer metal stack comprising a metal having a hexagonal {002} orientation or a metal having a cubic {111} orientation.

5. The piezoelectric device of claim 4,
wherein if the single-layer metal stack comprises a metal having a hexagonal {002} orientation, the metal stack includes one of hexagonal titanium (Ti) having a {002} orientation and hexagonal scandium (Sc) having a {002} orientation, and
wherein if the single-layer metal stack comprises a metal having a cubic {111} orientation, the metal stack includes one of tantalum nitride (TaN) having a {111} orientation, cubic niobium nitride (NbN) having a {111} orientation, and cubic aluminum scandium ($Al_3Sc$) having a {111} orientation.

6. The piezoelectric device of claim 1,
wherein the metal stack comprises a double-layer metal stack,
wherein a first layer of the double-layer metal stack is formed on the surface of the substrate, the first layer comprising a metal having a first orientation, wherein a second layer of the double-layer metal stack is formed on a surface of the first layer of the metal stack, the second layer comprising a metal having a second orientation, and wherein one of the first orientation and the second orientation is a hexagonal {002} orientation and one of the first orientation and the second orientation is a cubic {111} orientation.

7. The piezoelectric device of claim 6, wherein the first layer comprises one of hexagonal titanium (Ti) having a {002} orientation, hexagonal scandium (Sc) having a {002} orientation, cubic tantalum nitride (TaN) having a {111} orientation, cubic niobium nitride (NbN) having a {111} orientation, and cubic aluminum scandium ($Al_3Sc$) having a {111} orientation.

8. The piezoelectric device of claim 6, wherein the second layer comprises aluminum (Al).

9. The piezoelectric device of claim 8, wherein the second layer comprises an alloy of aluminum (Al) and copper (Cu) containing approximately 0.5 wt % Cu.

10. The piezoelectric device of claim 1,
wherein the metal stack comprises a triple-layer metal stack,
wherein a first layer of the triple-layer metal stack is formed on the surface of the substrate, the first layer comprising a metal having a first orientation,
wherein a second layer of the double-layer metal stack is formed on a surface of the first layer of the metal stack, the second layer comprising a metal having a second orientation, and wherein a third layer of the double-layer metal stack is formed on a surface of the second layer of the metal stack, and wherein one of the first orientation and the second orientation is a hexagonal {002} orientation and one of the first orientation and the second orientation is a cubic {111} orientation.

11. The piezoelectric device of claim 10, wherein the first layer comprises one of hexagonal titanium (Ti) having a {002} orientation, hexagonal scandium (Sc) having a {002} orientation, cubic tantalum nitride (TaN) having a {111} orientation, cubic niobium nitride (NbN) having a {111} orientation, and cubic aluminum scandium ($Al_3Sc$) having a {111} orientation.

12. The piezoelectric device of claim 10, wherein the second layer comprises titanium nitride (TiN).

13. The piezoelectric device of claim 10, wherein the third layer comprises aluminum (Al).

14. The piezoelectric device of claim 13, wherein the third layer comprises an alloy of aluminum (Al) and copper (Cu) containing approximately 0.5 wt % Cu.

15. The piezoelectric device of claim 1, wherein the metal stack is formed under continuous vacuum conditions.

16. The piezoelectric device of claim 1, wherein at least a portion of the metal stack is deposited by an ionized metal plasma (IMP) process.

* * * * *